(12) United States Patent
Yamazaki et al.

(10) Patent No.: US 7,465,482 B2
(45) Date of Patent: Dec. 16, 2008

(54) FILM, PACKAGING MATERIAL, CONTAINER, LENS, WINDOW, SPECTACLES, RECORDING MEDIUM, AND DEPOSITION APPARATUS

(75) Inventors: Shunpei Yamazaki, Tokyo (JP); Hideaki Kuwabara, Kanagawa (JP); Toru Takayama, Kanagawa (JP)

(73) Assignee: Semiconductor Energy Laboratory Co., Ltd., Kanagawa-Ken (JP)

( * ) Notice: Subject to any disclaimer, the term of this patent is extended or adjusted under 35 U.S.C. 154(b) by 334 days.

(21) Appl. No.: 10/266,919

(22) Filed: Oct. 9, 2002

(65) Prior Publication Data
US 2003/0091871 A1  May 15, 2003

(30) Foreign Application Priority Data
Oct. 10, 2001  (JP)  ............... 2001-313128

(51) Int. Cl.
*B29D 22/00* (2006.01)
*B29D 23/00* (2006.01)
*B32B 1/08* (2006.01)

(52) U.S. Cl. .................. 428/35.7; 428/36.6; 428/36.7; 428/35.2; 428/35.4; 428/34.4; 428/34.6; 428/432; 428/689; 428/433; 428/650; 428/824; 428/824.1; 428/824.2; 428/824.3; 428/824.4; 428/698; 428/701; 428/702; 428/704

(58) Field of Classification Search .......... 428/35.7, 428/36.6, 36.7, 35.2, 35.4, 34.4, 34.6, 426, 428/432, 457, 689, 692, 694 R, 694 ML, 428/694 SC, 694 DE, 694 NF, 698, 701, 428/702, 704, 433, 650, 824, 824.1, 824.2, 428/824.3, 824.4; 204/192.12, 298, 192.14, 204/192.15, 298.01, 298.02, 298.07, 298.08, 204/298.12; 118/715, 720, 723 I, 728
See application file for complete search history.

(56) References Cited

U.S. PATENT DOCUMENTS 3,939,834 A  *  2/1976  McMahon ............... 128/272

(Continued)

FOREIGN PATENT DOCUMENTS
EP  0 207 216  9/1987

(Continued)

OTHER PUBLICATIONS

Notice of Reasons for Rejection for Application No. 2001-313128; Mailed Jan. 31, 2006 (Full Translation).

*Primary Examiner*—Michael C Miggins
(74) *Attorney, Agent, or Firm*—Nixon Peabody LLP; Jeffrey L. Costellia (57) ABSTRACT

The object is to provide a thin film having high barrier properties and high translucency with no safety and health problems, which is capable of suppressing degradation due to moisture, oxygen and carbon dioxide gas and degradation due to the diffusion of impurities such as alkali metals and alkali earth metals, a deposition apparatus of the thin film, and products coated with the thin film by the deposition apparatus. Another object is to provide an extended usable range of the products of an environmentally friendly biodegradable material and a prolonged quality preservation period. The feature is that a single layer or laminated layer of a layer expressed by $AlN_xO_y$ or layer expressed by $Al_xN_y$ is deposited (coated) over the inner surface of a packaging film. The single layer or laminated layer thereof has high translucency, being capable of enhancing the barrier properties against moisture, oxygen and carbon dioxide gas, the heat resisting properties, and the mechanical strength. When the biodegradable material is used for the packaging film, the usable range of the products can be extended and the quality preservation period can be prolonged as well.

24 Claims, 8 Drawing Sheets

U.S. PATENT DOCUMENTS

| | | | |
|---|---|---|---|
| 4,643,950 A | | 2/1987 | Ogura et al. |
| 4,911,814 A | * | 3/1990 | Matsuoka et al. ...... 204/298.17 |
| 5,085,926 A | * | 2/1992 | Iida et al. .................... 428/216 |
| 5,096,862 A | * | 3/1992 | Mathers et al. ............ 501/96.1 |
| 5,135,814 A | * | 8/1992 | Dekosky .................... 428/432 |
| 5,583,369 A | | 12/1996 | Yamazaki et al. |
| 5,668,524 A | | 9/1997 | Aida et al. |
| 5,736,207 A | | 4/1998 | Walther et al. |
| 5,777,543 A | | 7/1998 | Aida et al. |
| 5,900,285 A | | 5/1999 | Walther et al. |
| 5,946,561 A | | 8/1999 | Yamazaki et al. |
| 6,083,628 A | * | 7/2000 | Yializis ...................... 428/463 |
| 6,106,983 A | | 8/2000 | Burke |
| 6,165,598 A | * | 12/2000 | Nelson ...................... 428/212 |
| 6,268,695 B1 | | 7/2001 | Affinito |
| 6,358,766 B1 | | 3/2002 | Kasahara |
| 6,413,645 B1 | * | 7/2002 | Graff et al. .................. 428/446 |
| 6,426,245 B1 | | 7/2002 | Kawasaki et al. |
| 6,449,239 B1 | * | 9/2002 | Uno et al. ................. 369/275.1 |
| 6,492,659 B1 | | 12/2002 | Yamazaki et al. |
| 6,514,591 B1 | | 2/2003 | Nagata et al. |
| 6,570,709 B2 | * | 5/2003 | Katayama et al. ........... 359/586 |
| 6,663,934 B2 | | 12/2003 | Nagata et al. |
| 6,710,446 B2 | * | 3/2004 | Nagai et al. ................. 257/737 |
| 7,045,091 B1 | | 5/2006 | Patel et al. |
| 7,045,438 B2 | | 5/2006 | Yamazaki et al. |
| 2001/0000680 A1 | * | 5/2001 | Matono et al. ........... 360/234.7 |
| 2002/0150775 A1 | * | 10/2002 | Ishikawa et al. ............ 428/458 |
| 2003/0047280 A1 | | 3/2003 | Takayama et al. |
| 2004/0209126 A1 | * | 10/2004 | Ziegler et al. ............... 428/702 |

FOREIGN PATENT DOCUMENTS

| | | |
|---|---|---|
| EP | 0709485 A1 | 5/1996 |
| EP | 0 773 166 A1 | 5/1997 |
| EP | 1 052 632 A2 | 11/2000 |
| JP | 59-121876 | 7/1984 |
| JP | 61-256663 | 11/1986 |
| JP | 64-35961 | 2/1989 |
| JP | 02-070059 A | 3/1990 |
| JP | 3-106027 | 5/1991 |
| JP | 4-192466 | 7/1992 |
| JP | 08-053116 A | 2/1996 |
| JP | 08-062590 | 3/1996 |
| JP | 08-068990 | 3/1996 |
| JP | 08-309044 | 11/1996 |
| JP | 08-318590 | 12/1996 |
| JP | 09-173662 | 7/1997 |
| JP | 10-024518 | 1/1998 |
| JP | 2000-030309 | 1/2000 |
| JP | 2000-149339 | 5/2000 |
| JP | 2000-322770 | 11/2000 |
| JP | 3-145574 | 1/2001 |
| JP | 3-152857 | 1/2001 |
| JP | 11-077885 | 3/2001 |
| JP | 2001-067719 | 3/2001 |
| JP | 3145574 | 3/2001 |
| JP | 3-176219 | 4/2001 |
| JP | 3-181006 | 4/2001 |
| JP | 3152857 | 4/2001 |
| JP | 3176219 | 6/2001 |
| JP | 3181006 | 7/2001 |
| JP | 3-273110 | 1/2002 |
| JP | 3273110 | 4/2002 |

* cited by examiner

FILM, PACKAGING MATERIAL, CONTAINER, LENS, WINDOW, SPECTACLES, RECORDING MEDIUM, AND DEPOSITION APPARATUS

BACKGROUND OF THE INVENTION

The present invention relates to a deposition apparatus for coating base materials and coated base materials (packaging materials, building materials, machines, devices, recording media, toys, sports goods, biomedical materials, agricultural materials, daily necessities and miscellaneous goods), particularly to thin films for coating.

In wide ranging applications including general packaging materials such as typical snack food bags, building materials, machines, devices, recording media, toys, sports goods, biomedical materials, agricultural materials, daily necessities and miscellaneous goods (clothing and accessories), transparent protective films excellent in barrier properties are demanded.

In addition, with growing concern about environmental issues in recent years, products not adversely affecting the environment are sought in general manufactured goods, particularly in plastic goods, which are decomposed and decayed over time when they are discarded in the natural environment.

For snack food bags, products in which an aluminium foil is laminated over a synthetic resin film to add the light blocking effect are usually used. Synthetic resin films unfriendly to the natural environment are used for traditional snack food bags. When the bags are discarded in the natural environment, they remain semi-permanently, thus causing problems.

Then, biodegradable plastic materials have attracted attention. The biodegradable plastics are known that they are gradually decayed and decomposed in soils and waters by hydrolysis and biodegradation and they finally become non-hazardous decomposed products by the action of microorganism. The biodegradable plastics that are currently studied toward the practical use are aliphatic polyesters, modified PVAs (polyvinyl alcohols), cellulose ester compounds, starch modifications, and blend compounds of these.

SUMMARY OF THE INVENTION

Generally, films made of plastics easily transmit moisture, oxygen, and carbon dioxide gas, which accelerate the degradation of foods containing fats and oils, for example. Thus, when the foods containing fats and oils are formed into packaged goods, the quality assurance period particularly tends to shorten.

In addition to this, plastics are easily affected by heat in general, and the materials themselves tend to be deformable.

Furthermore, other impurities, impurities from human perspiration (containing moisture and alkali metals), for example, are diffused through films, and they might accelerate alternation and degradation.

Particularly, environmentally friendly biodegradable plastic materials are gradually decayed and decomposed by hydrolysis and biodegradation, and thus they tend to transmit moisture and oxygen. In addition, when products containing moisture are packaged, decay and decomposition are to proceed from inside as well. Accordingly, the range of products using the biodegradable plastic materials is limited.

Furthermore, glass materials and plastic materials have significantly low thermal conductivity. They tend to adsorb vapor in the atmosphere to have water drops when temperatures suddenly change in an atmosphere containing water vapor. Therefore, windows, spectacles (including sunglasses) and goggles using glass lenses and plastic lenses have fogged easily by sudden temperature changes.

In the meantime, thin film deposition techniques of DLC films are known. There is JP2-70059 in which a DLC film deposition technique is used for coating laboratory ware such as a beaker and a flask. There is JP8-53116 in which the technique is used for coating the inner wall surface of a plastic container. However, the DLC films are very hard, and they are not suitable for applications of soft films. The DLC films are brown and have low transmission. Thus, the content looks brown even though it is transparent, giving bad impression.

In view of the problems, the object of the invention is to provide a thin film having high barrier properties and high translucency with no safety and health problems, which is capable of suppressing the degradation due to moisture, oxygen and carbon dioxide gas and the degradation due to the diffusion of impurities such as alkali metals and alkaline earth metals, a deposition apparatus of the same, and products having the thin film coated by the deposition apparatus.

In addition, another object of the invention is to widen the range of products in which environmentally friendly biodegradable materials are usable, and to prolong the quality preservation period.

The invention is characterized by depositing (coating) a single layer or laminated layer of a layer expressed by $AlN_xO_y$, or layer expressed by $Al_xN_y$ on the surface of a base material. The film thickness of the single layer or laminated layer of the layer expressed by $AlN_xO_y$ or layer expressed by $Al_xN_y$ is to range from 25 to 500 nm.

The single layer or laminated layer of the layer expressed by $AlN_xO_y$ or layer expressed by $Al_xN_y$ is deposited, whereby the heat resistance and mechanical strength of the base material can be enhanced. In addition, the base material can be protected against scratches. Furthermore, the single layer or laminated layer of the layer expressed by $AlN_xO_y$ or layer expressed by $Al_xN_y$ is deposited, whereby impurities from human perspiration (including moisture and alkali metals) are prevented from diffusing through a film, and the alternation and degradation can be suppressed.

Additionally, in the specification, the base material is not specified particularly. It may be base materials of any compositions such as plastics, glass, metals, ceramics, papers, rubbers, and woods. Furthermore, the shapes of the base material are not limited particularly. It may be those having flat surface, curved surface, flexibility, and a film shape. Moreover, when used as packaging materials and packaging containers, preferably are plastic films such as polyethylene terephthalate (PET), polyether sulfone (PES), polyethylene nafthalate (PEN), polycarbonate (PC), nylon, polyether ether ketone (PEEK), polysulfone (PSF), polyetherimide (PEI), polyallylate (PAR), and polybutylene terephthalate (PBT).

The configuration of the invention disclosed in the invention is a film characterized in that a single layer or laminated layer of a layer expressed by $AlN_xO_y$ or layer expressed by $Al_xN_y$ is deposited over one surface or both surfaces of the film.

In the film, the layer expressed by $AlN_xO_y$ has high translucency and flexibility, and it hardly generates cracks less than the DLC does, being capable to form into a soft film. For example, the layer expressed by $AlN_xO_y$ can be deposited over a very thin film made of polyethylene for packaging food. When foods containing fats and oils, which tend to be degradable by oxygen and moisture, are formed into packaged goods, the barrier properties against oxygen and moisture are enhanced, thereby to prolong the quality assurance period.

The film is characterized in that nitrogen contained in the layer expressed by $AlN_xO_y$ is 2.5 to 47.5 atm %, and oxygen is 2.5 to 47.5 atm %.

In addition, in the film, a thin film made of an organic substance may be further deposited in order to prevent cracks from being generated to peal off a part of the layer expressed by $AlN_xO_y$. Furthermore, two or more layers of the single layer made of the layer expressed by $AlN_xO_y$ are formed, and a thin film made of an organic substance (hereafter, it is called stress relaxation film) may be further provided between the two layers. The laminated layer of the layer expressed by $AlN_xO_y$ with the stress relaxation film provides further flexibility, which can prevent cracks when bent.

Moreover, the film can be used to form sealing bags (also called pouch) with general structures for packaging various things and sealing bags with reclosable chuck. In this case, the barrier properties against moisture, oxygen and carbon dioxide gas, the heat resisting properties and the mechanical strength can be enhanced. Particularly, when foods containing fats and oils, which tend to be degradable by oxygen and moisture, are formed into packaged goods, the barrier properties against oxygen and moisture are enhanced. Thus, the quality assurance period can be prolonged.

Another configuration of the invention is a packaging material characterized in that a single layer or laminated layer of a layer expressed by $AlN_xO_y$ or layer expressed by $Al_xN_y$ is deposited over an outer surface or inner surface of a bag made of a plastic material.

Additionally, in order to prevent cracks from being generated to peal off a part of the layer expressed by $AlN_xO_y$ in the packaging material, a thin film made of an organic substance may be further deposited. Furthermore, two or more layers of the single layer made of the layer expressed by $AlN_xO_y$ are formed, and a thin film made of an organic substance (hereafter, it is called stress relaxation film) may be provided between the two layers. The laminated layer of the layer expressed by $AlN_xO_y$ with the stress relaxation film provides further flexibility, which can prevent cracks when bent.

Moreover, biodegradable materials may be used as the packaging material. The single layer or laminated layer of the layer expressed by $AlN_xO_y$ or layer expressed by $Al_xN_y$ is coated over the inner surface, whereby the barrier properties against oxygen and moisture can be enhanced and the quality preservation period can be prolonged without impairing the biodegradable properties. The configuration of the invention disclosed in the specification is a packaging material characterized in that a single layer or laminated layer of a layer expressed by $AlN_xO_y$ or layer expressed by $Al_xN_y$ is deposited over the inner surface of a bag made of a biodegradable plastic material.

In addition, a biodegradable plastic material is used as the biodegradable material here, but it is a typical example. It goes without saying that it is not limited particularly.

Furthermore, the single layer or laminated layer of the layer expressed by $AlN_xO_y$ or layer expressed by $Al_xN_y$ is coated over the inner surface, whereby packaged goods containing moisture or packaged goods of liquid containing moisture can be packaged with a biodegradable material, extending the usable range of the biodegradable material.

Each of the packaging materials is characterized in that nitrogen contained in the layer expressed by $AlN_xO_y$ is 2.5 to 47.5 atm %, and oxygen is 2.5 to 47.5 atm %.

Additionally, the invention is effective in coating containers such as beverage bottles made of plastics. Furthermore, it has high translucency, thus allowing the content to be seen clearly. The configuration of the invention disclosed in the specification is a container characterized in that a single layer or laminated layer of a layer expressed by $AlN_xO_y$ or layer expressed by $Al_xN_y$ is deposited over the outer wall surface or inner wall surface of the container made of a glass material or plastic material.

Additionally, in order to prevent cracks from being generated to peal off a part of the layer expressed by $AlN_xO_y$ in the container, a thin film made of an organic substance may be further deposited. Furthermore, two or more layers of the single layer made of the layer expressed by $AlN_xO_y$ are formed, and a thin film made of an organic substance (hereafter, it is called stress relaxation film) may be provided between the two layers. The laminated layer of the layer expressed by $AlN_xO_y$ with the stress relaxation film provides further flexibility, which can prevent cracks when bent.

Moreover, biodegradable materials may be used for a material for configuring the container. The inner surface is coated, whereby the barrier properties against oxygen and moisture are enhanced and the quality preservation period can be prolonged without impairing the biodegradable properties. The configuration of the invention disclosed in the specification is a container characterized in that a single layer or laminated layer of a layer expressed by $AlN_xO_y$ or layer expressed by $Al_xN_y$ is deposited over the inner wall surface of the container made of a biodegradable plastic material.

The single layer or laminated layer of the layer expressed by $AlN_xO_y$ or layer expressed by $Al_xN_y$ is coated over the inner surface of the container, whereby packaged goods containing moisture or packaged goods of liquid containing moisture can be packaged with a biodegradable material, extending the usable range of the biodegradable material.

Each of the containers is characterized in that nitrogen contained in the layer expressed by $AlN_xO_y$ is 2.5 to 47.5 atm %, and oxygen is 2.5 to 47.5 atm %.

In each of the containers, the layer expressed by $AlN_xO_y$ is flexible and hardly generates cracks as compared with a DLC, which can be formed into a container likely to be bent when used. Additionally, in each of the containers, the barrier properties against moisture, oxygen and carbon dioxide gas, the heat resisting properties, and the mechanical strength can be enhanced.

Furthermore, the layer expressed by $AlN_xO_y$ has high translucency, and thus it may be used for a protective film of lenses such as spectacles and magnifying glasses or protective film of windows. The configuration of the invention disclosed in the specification is a lens or window characterized in that a single layer or laminated layer of a layer expressed by $AlN_xO_y$ or layer expressed by $Al_xN_y$ is deposited over the surface.

Each of the lenses or windows is characterized in that nitrogen contained in the layer expressed by $AlN_xO_y$ is 2.5 to 47.5 atm %, and oxygen is 2.5 to 47.5 atm %.

Additionally, the single layer or laminated layer of the layer expressed by $AlN_xO_y$ or layer expressed by $Al_xN_y$ has high thermal conductivity, to thereby prevent spectacles and windows from fogging. Furthermore, the barrier properties against moisture, oxygen and carbon dioxide gas, the heat resisting properties, and the mechanical strength can be enhanced in the spectacles and windows.

Moreover, it is acceptable that it is set X<Y when the translucency is important as purposes in each layer expressed by $AlN_xO_y$, whereas it is set X>Y when the barrier properties are important. Besides, when the translucency is not needed and the barrier properties are important, oxygen is preferably to be 0 to 10 atm %. In the specification, when it is considered that oxygen in the film is very little to be zero or oxygen is an impurity, the film is called the layer expressed by $Al_xN_y$ ($Al_xN_y$ film).

In addition, the layer expressed by $AlN_xO_y$ has high translucency, and thus it may be used as a protective film for recording media, typically optical discs. The configuration of the invention disclosed in the specification is a recording medium characterized in that a single layer or laminated layer of a layer expressed by $AlN_xO_y$ or layer expressed by $Al_xN_y$ is deposited over the surface.

In this manner, each of the single layer or laminated layer of the layer expressed by $AlN_xO_y$ or layer expressed by $Al_xN_y$ can be formed into a coating film for various base materials (packaging materials, building materials, machines, devices, recording media, toys, sports goods, biomedical materials, agricultural materials, daily necessities and miscellaneous goods).

Figure 1:
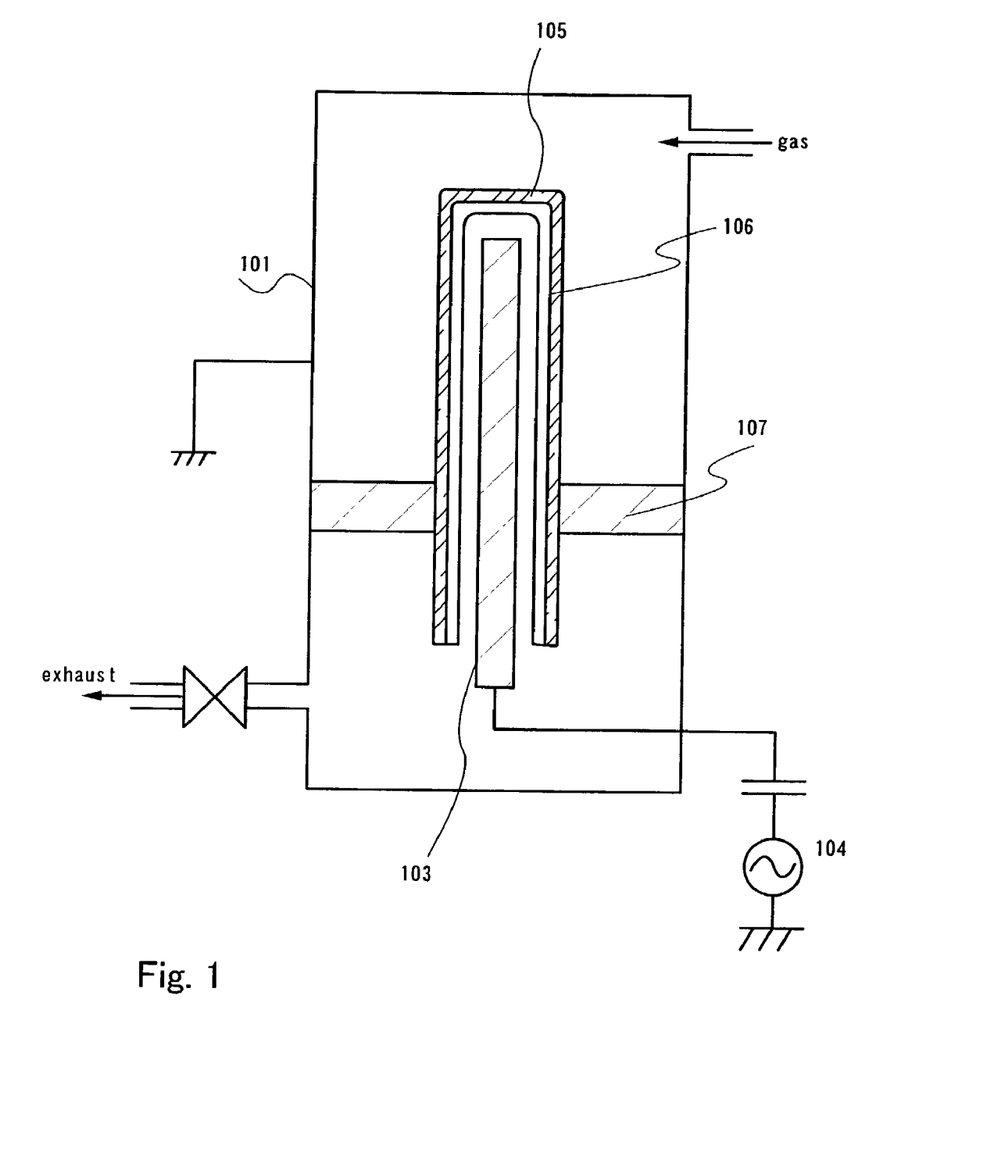
FIG. 1 is a diagram depicting a deposition apparatus of the invention.
Figure 4:
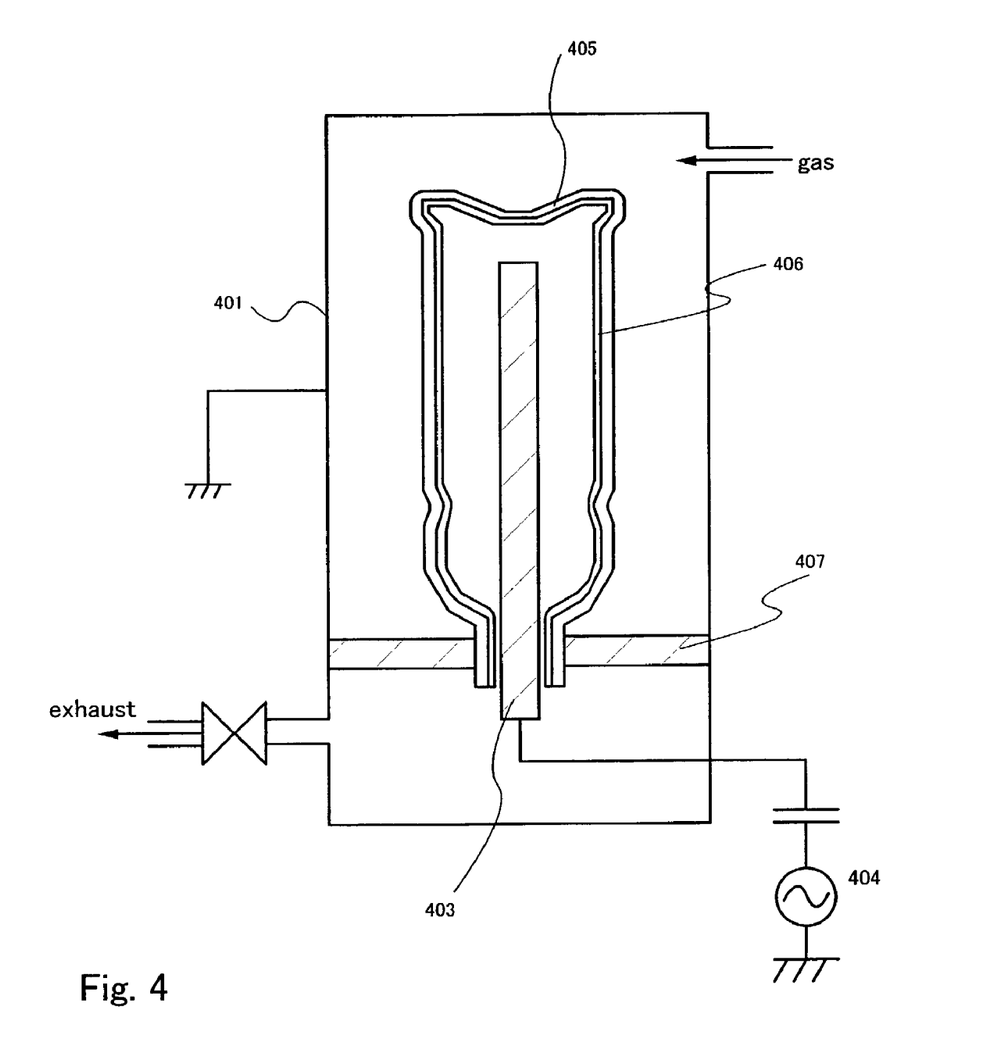
FIG. 4 is a diagram depicting a deposition apparatus of the invention.

The deposition apparatus of the invention for implementing the structures, as shown in FIGS. 1 and 4, has a chamber, a gas inlet system, an exhaust system, a bar-shaped target, an RF power supply connected to the target, and a holder for fixing a product to be processed, wherein the product to be processed that is placed in the chamber is a bag-shaped or container-shaped product having an opening part, the bar-shaped target is inserted into the opening part for positioning, and then the inner surface of the product to be processed undergoes deposition by sputtering.

The deposition apparatus is characterized in that the bar-shaped target is disposed to the inner surface of the product to be processed at a fixed distance. Additionally, the chamber is connected to earth or fixed potential.

When the $AlN_xO_y$ film (X<Y) is deposited with the deposition apparatus, the feature is that the bar-shaped target is a target made of AlN or Al, and oxygen, nitrogen, or rear gas is introduced from the gas inlet system for deposition.

When the $AlN_xO_y$ film (X>Y) or $Al_xN_y$ film is deposited with the deposition apparatus, the feature is that the bar-shaped target is a target made of AlN or Al, and nitrogen or rear gas is introduced from the gas inlet system for deposition.

BRIEF DESCRIPTION OF THE DRAWINGS

The teachings of the invention can be readily understood by considering the following detailed description in conjunction with the accompanying drawings, in which.

DESCRIPTION OF THE PREFERRED EMBODIMENT

Hereafter, the embodiments of the invention will be described.

Embodiment 1

A single layer or laminated layer of a layer expressed by $AlN_xO_y$ or layer expressed by $Al_xN_y$ deposited over a base material (product to be processed) is deposited by sputtering with the use of a deposition apparatus shown in FIG. 1. Here, shown is an example that the inside of a bag-shaped or box-shaped packaging film undergoes deposition.

The inside of a chamber 101 connected to an earth is vacuumed, and oxygen gas and inert gas (Ar gas or nitrogen gas) are flown. A target electrode 103 made of AlN is connected to an RF power supply 104. A packaging film 105 is fixed by a holder 107 between the target electrode 103 and the chamber 101. A layer expressed by $AlN_xO_y$ ($AlN_xO_y$ film) 106 is deposited over the inner surface of the packaging film 105. However, the outer surface of the packaging film 105 is not deposited.

Here, a bag-shaped or box-shaped product is shown as the packaging film 105 in the drawing, but the product layering two sheets to crimp four sides may be used. As materials for the packaging film 105, resin materials (polyester, polypropylene, polyvinylchloride, polystyrene, polyacrylonitrile, polyethylene terephthalate, and nylon), typically thermoplastics, PVF (polyvinylfluoride) films, Mylar films, or acrylate resin films may be used.

Additionally, when biodegradable plastics (typically, alphatic polyesters, modified PVAs (polyvinyl alcohol), cellulose ester compounds, starch modifications, and blend compounds of these) are used as materials for the packaging film 105 and the $AlN_xO_y$ film is deposited over only the inside, packaged goods are protected and the packaging film is decomposed from only the outside. That is, the packaging film is gradually decayed and decomposed in soils and waters by hydrolysis and biodegradation, and it finally becomes a non-hazardous decomposed product by the action of microorganism. Furthermore, when the biodegradable plastics are used as materials for the packaging film 105 and the $AlN_xO_y$ film is deposited over only the inside, the usable range of products can be extended and decay and degradation do not proceed from the inside even though packaged goods containing moisture or water are formed, allowing the quality preservation period to be prolonged.

Moreover, FIG. 4 is an example that the $AlN_xO_y$ film is deposited inside a container, typically a beverage bottle. In FIG. 4, 401 denotes a chamber connected to an earth, 404 denotes an RF power supply, 403 denotes a target electrode made of AlN, 405 denotes a container fixed by a holder 407 between the target electrode 403 and the chamber 401, and 406 denotes a layer expressed by $AlN_xO_y$ ($AlN_xO_y$ film) over the inner surface of the container 405. When the $AlN_xO_y$ film is coated inside the container such as a beverage bottle made of plastics, the content can be seen clearly because of high translucency without impairing the appearance. Besides, it can be formed into a container with high barrier properties against moisture, oxygen, and carbon dioxide gas even when carbonated water is used.

In addition, FIGS. 1 and 4 describe a single layer of the $AlN_xO_y$ film, but a laminated layer with an $AlN_xO_y$ film having different compositions, layer expressed by $Al_xN_y$ or laminated layer of these is acceptable.

Furthermore, the bar-shaped (cylindrical or prismatic) target electrode is shown in FIGS. 1 and 4, but it is needless to say that it is not limited particularly. The target is preferably disposed to the inner surface of the product to be processed at a fixed distance. Thus, it is acceptable to shape the target matching with the shape of the product to be processed.

Embodiment 2

Figure 2A:
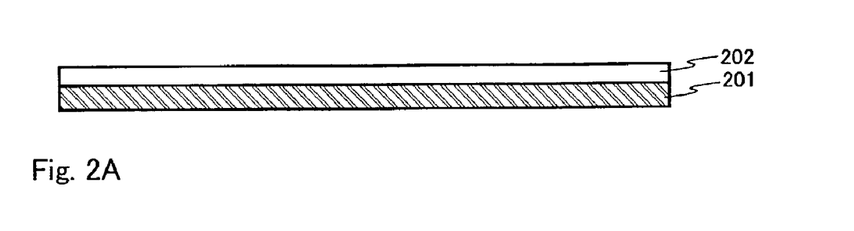
FIGS. 2A to 2C are cross sections depicting organic films of the invention.
Figure 2B:
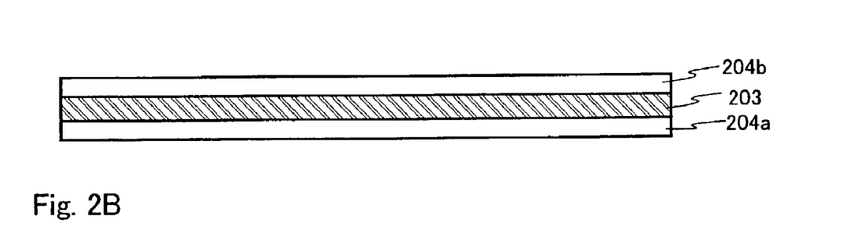

FIGS. 2A and 2B are diagrams schematically depicting examples of films made of an organic material of the invention.

Additionally, an organic film having a single layer or laminated layer of a layer expressed by $AlN_xO_y$ or layer expressed by $Al_xN_y$ over one surface is also one of the invention. FIG. 2A is a diagram depicting an organic film 201 having a single layer of an $AlN_xO_y$ film 202 deposited over one surface.

Furthermore, an organic film having a single layer or laminated layer of a layer expressed by $AlN_xO_y$ or layer expressed by $Al_xN_y$ over both surfaces is also one of the invention. FIG. 2B is a diagram depicting an organic film 203 having single layers of $AlN_xO_y$ films 204a and 204b deposited over both surfaces.

The organic films here are specifically the single layer or laminated layer of polymer film. As the organic films used in the invention, named are polyvinyl alcohol films, ethylenevinylalchohol films, cellulose films, and polycarbonate films.

The single layer or laminated layer of the layer expressed by $AlN_xO_y$ or layer expressed by $Al_xN_y$ is deposited over one surface or both surfaces of the organic film, whereby a film that has the function of effectively preventing the contamination of impurities such as alkali metals and alkali earth metals can be formed. In addition to this, the single layer or laminated layer of the layer expressed by $AlN_xO_y$ or layer expressed by $Al_xN_y$ has the advantage of diffusing heat and the advantage of protecting the organic film against deformation and alternation.

Figure 5:
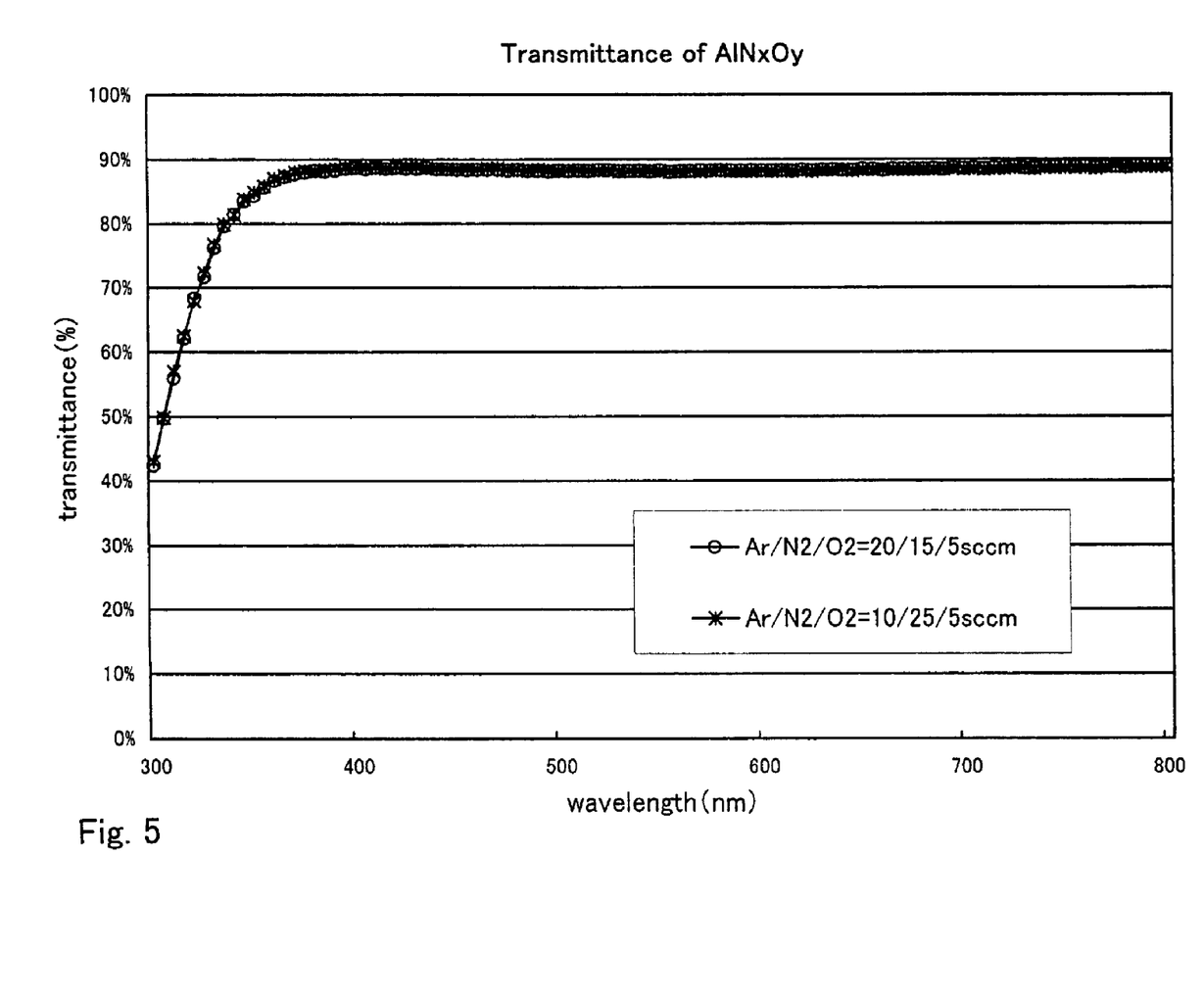
FIG. 5 is a graph depicting the transmittance of the $AlN_xO_y$ film (X<Y) of the invention.

Here, FIG. 5 depicts the transmittance of the $AlN_xO_y$ film (X<Y) at a film thickness of 100 nm. As shown in FIG. 5, the $AlN_xO_y$ film has 80 to 90% of significantly high translucency in the visible light area.

Figure 6:
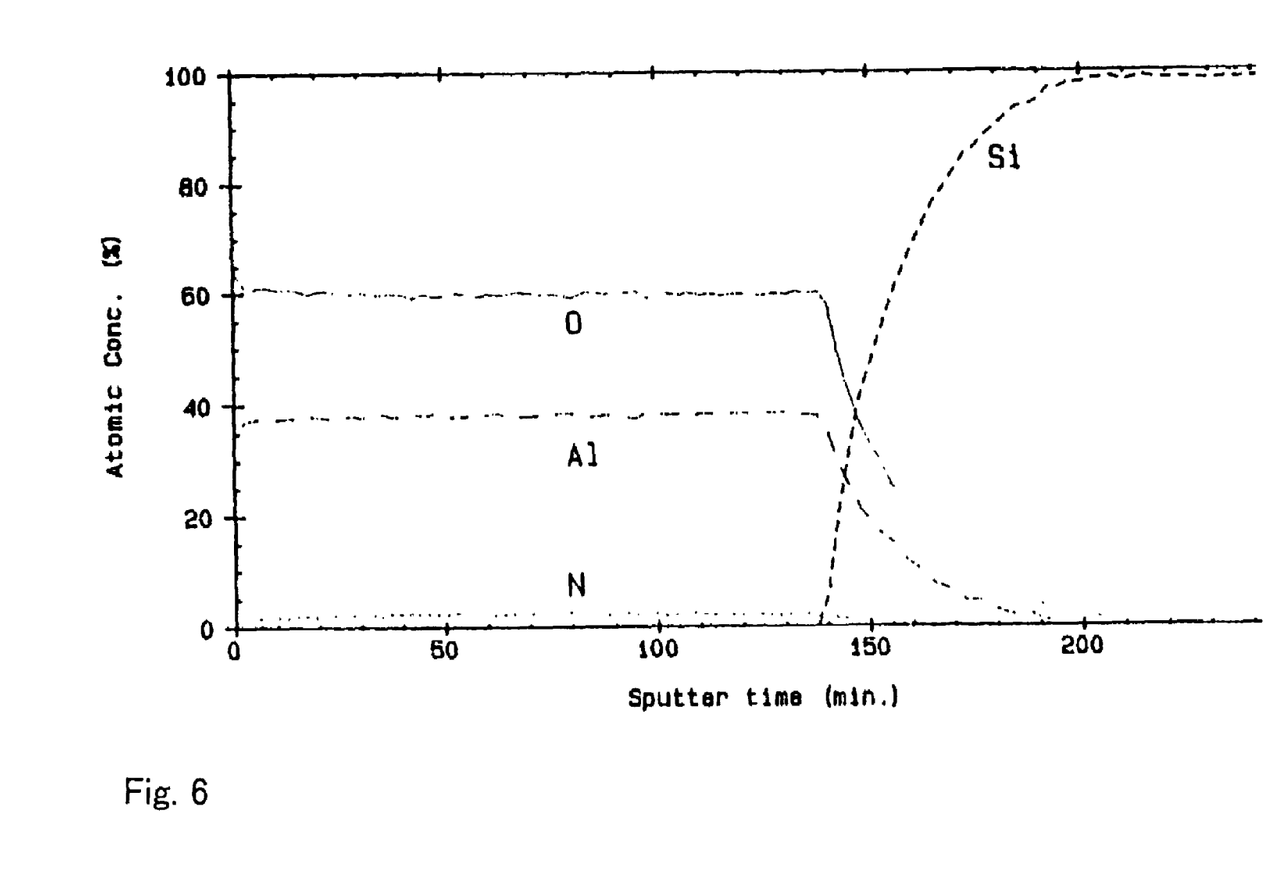
FIG. 6 is a diagram depicting compositions based on ESCA data of the $AlN_xO_y$ film (X<Y) of the invention.

In the invention, the $AlN_xO_y$ film is deposited by sputtering with an aluminium nitride (AlN) target under an atmosphere of argon gas mixed with nitrogen gas and oxygen gas. When the rear gas represented by argon gas is used, the film contains the rear gas. It is acceptable that the $AlN_xO_y$ film (X<Y) contains a few atm % or greater of nitrogen, preferably 2.5 to 47.5 atm % in the film, and it contains 2.5 to 47.5 atm % of oxygen. The sputtering conditions (substrate temperatures, inlet gases and the flow rate thereof, and deposition pressure) are properly adjusted, whereby nitrogen concentrations and oxygen concentrations can be adjusted. Additionally, FIG. 6 depicts the compositions of the $AlN_xO_y$ film based on ESCA (Electron Spectroscopy for Analysis) data, the $AlN_xO_y$ film was obtained by depositing it over a silicon substrate. Furthermore, it is acceptable that an aluminium (Al) target is used to for deposition under an atmosphere containing nitrogen gas and oxygen gas.

Moreover, it is acceptable that the sputtering conditions such as the flow rate of the inlet gas are changed to deposit the $AlN_xO_y$ film (X≧Y), or to deposit an $AlN_xO_y$ film (X<Y) or $AlN_xO_y$ film (X≧Y) having a concentration gradient of nitrogen or oxygen in the film thickness direction of the film.

Figure 7:
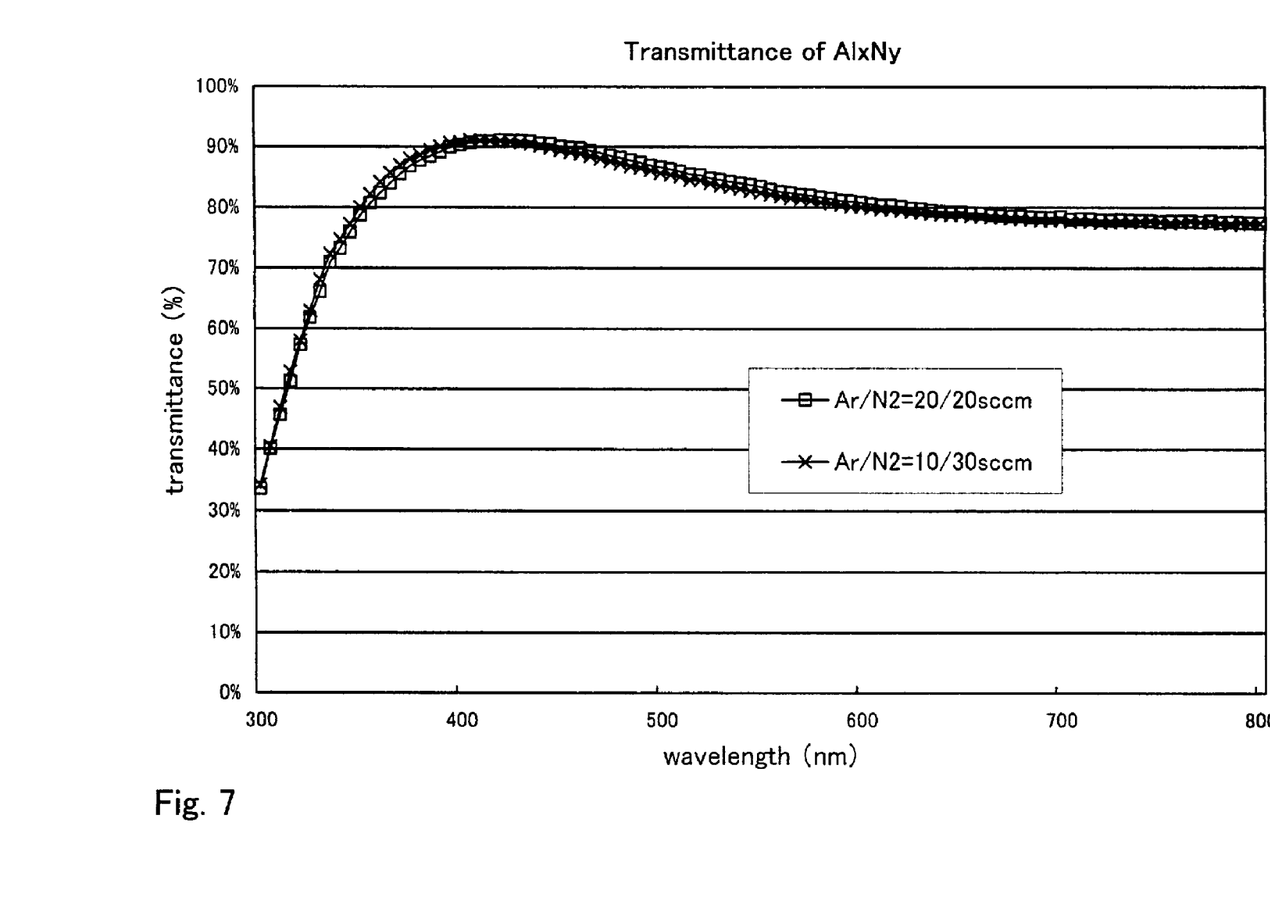
FIG. 7 is a graph depicting the transmittance of the $Al_xN_y$ film of the invention.

Besides, FIG. 7 depicts the transmittance of the $Al_xN_y$ film at a film thickness of 100 nm. It has a lower average of translucency than that of the $AlN_xO_y$ film (X<Y) shown in FIG. 5, but it has 80 to 91.3% of high transmittance in the visible light area.

Figure 8:
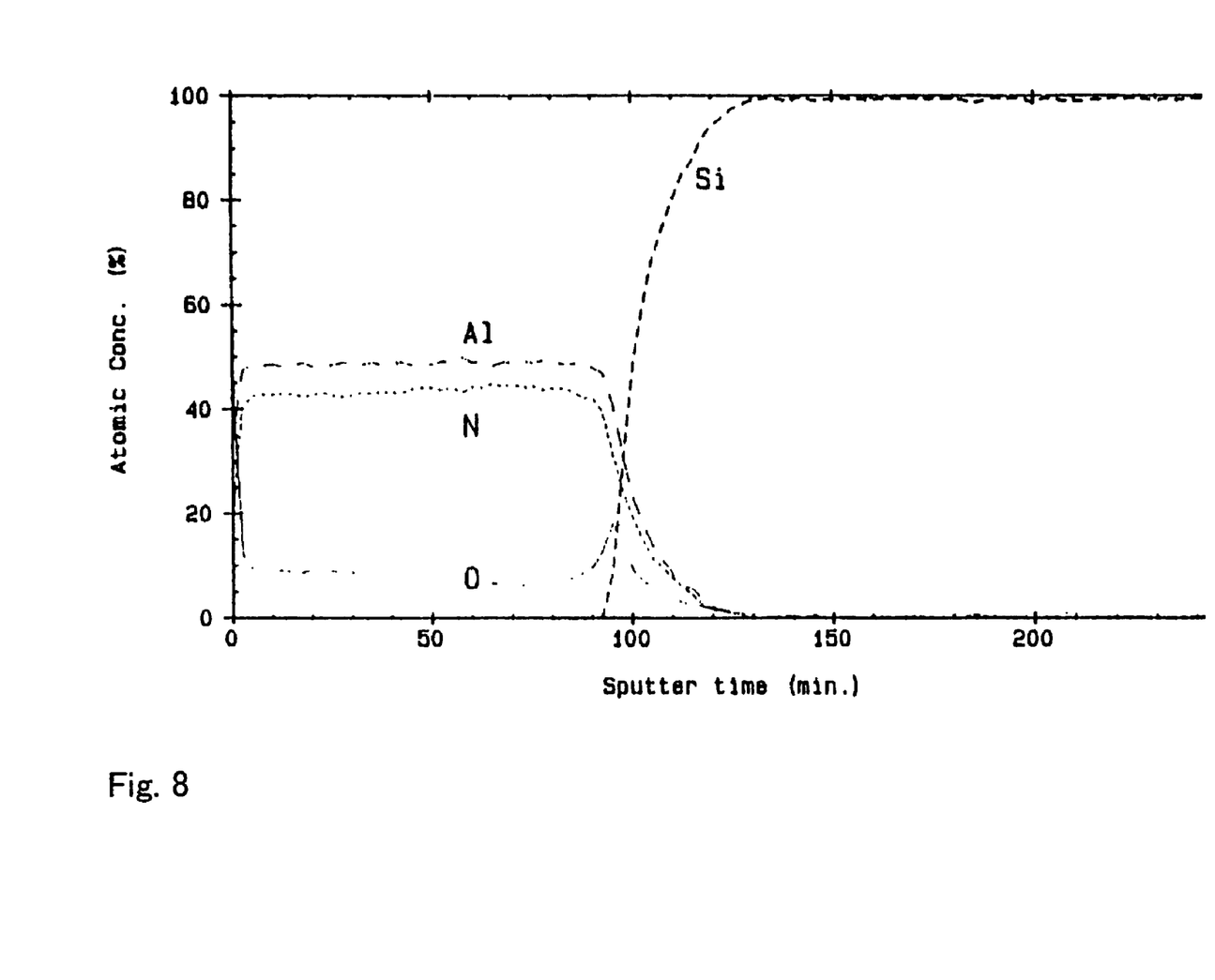
FIG. 8 is a diagram depicting the compositions of the $Al_xN_y$ film based of the ESCA data.

In the invention, the $Al_xN_y$ film is deposited by sputtering with an aluminium nitride (AlN) target, for example, under an atmosphere of argon gas mixed with nitrogen gas. When the rear gas represented by argon gas is used, the film contains the rear gas. It is acceptable that the impurities contained in the $Al_xN_y$ film, particularly oxygen is below 0 to 10 atm %. The sputtering conditions (substrate temperatures, inlet gases and the flow rate thereof, and deposition pressure) are properly adjusted, whereby oxygen concentrations can be adjusted. It is acceptable that the $Al_xN_y$ film contains a few atm % or greater of nitrogen, preferably 2.5 to 47.5 atm % in the film, and it contains 47.5 atm % or below of oxygen, preferably below 0 to 10 atm %. In addition, FIG. 8 depicts the compositions of the $Al_xN_y$ film based on the ESCA data, the $Al_xN_y$ film was obtained by depositing it over a silicon substrate. Furthermore, it is acceptable that an aluminium (Al) target is used for deposition under an atmosphere containing nitrogen gas.

Moreover, it is acceptable that the sputtering conditions such as the flow rate of the inlet gas are changed to deposit an $Al_xN_y$ film having a concentration gradient of nitrogen or oxygen in the film thickness direction of the film.

Besides, it is acceptable that a layer expressed by $Al_2O_3$ is deposited over the $AlN_xO_y$ film or $Al_xN_y$ film. When the layer expressed by $Al_2O_3$ is deposited, an aluminium oxide ($Al_2O_3$) target, for example, is used for deposition by sputtering under an argon atmosphere. Additionally, it is acceptable that an aluminium (Al) target is used for deposition under an atmosphere containing oxygen gas.

The organic films thus obtained can be used for packaging materials. It is acceptable that they are formed into a very thin, translucent film. Furthermore, the organic films can be used to form sealing bags (also called pouch) having a general structure for packaging various things and sealing bags with reclosable chuck. In this case, the barrier properties against moisture, oxygen and carbon dioxide gas, the heat resisting properties, and the mechanical strength can be enhanced.

Moreover, it is acceptable in the organic films that a thin film made of an organic substance is further deposited in order to prevent cracks from being generated to peal off a part of the layer expressed by $AlN_xO_y$. Besides, it is acceptable that two or more layers of the single layer made of the layer expressed by $AlN_xO_y$ are formed, and a thin film made of an organic substance (hereafter, it is called stress relaxation film) may be further provided between the two layers. The laminated layer of the layer expressed by $AlN_xO_y$ with the stress relaxation film provides flexibility, which can prevent cracks when bent.

In addition, the organic films can be used as a tape when an adhesive is applied to one surface.

Furthermore, the organic films can be used as a protective film for electronic desk calculators, electronic clocks, personal digital assistances, word processors, display devices for meters of automobiles and machines, sunglasses, goggles, protective eyeglasses, three-dimensional eyeglasses, and display devices (CRTs and LCDs). Moreover, the single layer or laminated layer of the layer expressed by $AlN_xO_y$ or layer expressed by $Al_xN_y$, which has high thermal conductivity, is deposited over the surface of the organic films. Thus, the organic films can be formed to be hardly subject to water drops and fog. In that point, they are optimal for a protective film.

Besides, it is acceptable that the single layer or laminated layer of the layer expressed by $AlN_xO_y$ is coated over screens for motor-cycles, windows such as automobile windshields, side visors for vehicles, windows for ships, windows for airplanes, and windows for buildings, which are made of plastics, for protection. When the single layer or laminated layer of the layer expressed by $AlN_xO_y$ or layer expressed by $Al_xN_y$, which has high thermal conductivity, is deposited over the surface of the windows, the windows are formed to be hardly subject to water drops and fog.

Figure 2C:
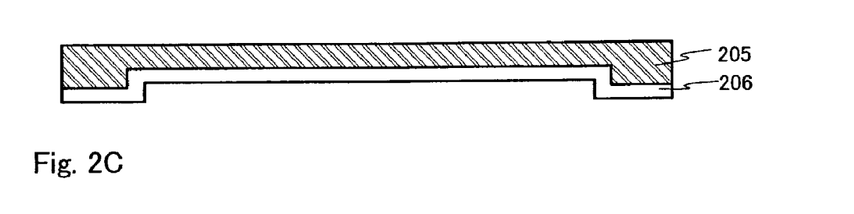

FIG. 2C is a diagram schematically depicting an example of a covering material of the invention. Here, a covering material 205 having a recessed part is shown, but the shape is not defined particularly. In addition, an example of depositing the $AlN_xO_y$ film over one surface is shown, but the $AlN_xO_y$ film may be deposited over both surfaces.

As shown in FIG. 2C, it is acceptable that the single layer or laminated layer of the layer 206 expressed by $AlN_xO_y$ is coated over the covering material 205 to form covering materials for electronic desk calculators, electronic clocks, personal digital assistances, word processors, display devices for meters of automobiles and machines, light emitting devices typically having liquid crystal displays and organic light emitting devices (OLED), and electrophoretic displays.

Furthermore, the electrophoretic display (electrophoretic display device) is also called electronic paper, which has advantages of the same legibility as paper, lower power consumption than other display devices, and being capable of forming into a thin, light shape. Various forms can be considered for the electrophoretic display. The electrophoretic display is that a plurality of microcapsules containing a first particle having positive charge and a second particle having negative charge is dispersed in a solvent or solute, an electric filed is applied to the microcapsules to move the particles inside the microcapsules in the opposite directions each other, and only the color of the particles moved on one side is displayed. Additionally, the first particle or the second particle contains dye, which are not moved when there is no electric filed. Furthermore, the color of the first particle is different from the color of the second particle (including no color). It is called electronic ink that the microcapsules are dispersed in the solvent. The electronic ink can be printed on the surfaces of glass, plastics, fabric, and paper. Moreover, the use of color filters or particles having pigment allows color display as well. Besides, for the first and second particles in the microcapsules, one kind of material selected from conductor materials, insulating materials, semiconductor materials, magnetic materials, liquid crystal materials, ferroelectric materials, electroluminescent materials, electrochromic materials, and magnetophoretic materials or composite material of these may be used.

Among them, the light emitting device having the OLED with the covering material made of plastics tends to transmit moisture and oxygen, and moisture and oxygen facilitate degradation in the organic luminescent layer, thus having a particular disadvantage that the lifetime of the light emitting device tends to become short. However, the layer expressed by $AlN_xO_y$ is deposited over the surface of the covering material, whereby sufficiently preventing moisture and oxygen from entering the organic luminescent layer.

Here, to confirm the effect of blocking moisture and oxygen by the $AlN_xO_y$ film, an experiment was conducted for examining variation per hour, in which a sample of an OLED sealed with a film substrate deposited with the $AlN_xO_y$ film having a film thickness of 200 nm and a sample of an OLED sealed with a film substrate deposited with an SiN film having a film thickness of 200 nm were prepared and allowed to stand in a water vapor atmosphere heated at a temperature of 85° C. The sample of the $AlN_xO_y$ film had longer lifetime of the OLED than the sample of the SiN film, allowing light emission for a long time. This experiment shows that the $AlN_xO_y$ film is a film material that can further prevent substances such as impurities of moisture and oxygen from entering organic compound layers from the outside of the device than an SiN film does, the substances facilitate degradation in the organic compound layers.

In addition to this, when other impurities such as human perspiration and impurities from connecting parts are diffused to enter the organic luminescent layer and the active layer of TFTs, alteration and degradation might be facilitated. However, the $AlN_xO_y$ film also has the advantage of blocking the impurities to be diffused.

Here, to confirm the effect of blocking alkali metals by the $AlN_xO_y$ film, MOS characteristics (C-V characteristics) were measured, in which a thermally-oxidized film having a film thickness of 50 nm was deposited over a silicon substrate, the $AlN_xO_y$ film having a film thickness of 40 nm was deposited thereon, an aluminium electrode containing Li was formed thereon, an aluminium electrode containing Si was formed on the surface of the silicon substrate opposite to the surface where these films had been disposed, annealing was conducted at a temperature of 300° C. for one hour, and then BT stress test was conducted (±1.7 MV/cm, a temperature of 150° C. for one hour). Since the obtained C-V characteristics were shifted on the positive side when positive voltage was applied, that is, at the time of +BT, it could be confirmed that the cause of the shift was the $AlN_xO_y$ film that has the effect of blocking the alkali metal, not Li. For comparison, an AlLi alloy was formed above the MOS through an insulating film (a silicon nitride film having a film thickness of 100 nm), and then the MOS characteristics were similarly examined. When positive voltage was applied, that is, at the time of +BT, the C-V characteristics were greatly shifted to the negative side. The main cause can be considered that Li entered the active layer. The layer expressed by $AlN_xO_y$ is deposited over covering materials, whereby impurities such as alkali metals can be sufficiently prevented from entering the organic luminescent layer.

In addition, the single layer or laminated layer of the layer expressed by $AlN_xO_y$ or layer expressed by $Al_xN_y$ is coated over the surface of filters, which may be implemented over color filters that are disposed in electronic desk calculators, electronic clocks, personal digital assistances, word processors, liquid crystal display devices such as meters of automobiles and machines, for example. Accordingly, the filters themselves can be prevented from altering, and heat can be dispersed as well.

Furthermore, it is acceptable that the single layer or laminated layer of the layer expressed by $AlN_xO_y$ or layer expressed by $Al_xN_y$ is coated over the surface of cutting tools made of metals or ceramics to enhance the mechanical strength of kitchen knife, cutters, and electric shavers. The single layer or laminated layer of the layer expressed by $AlN_xO_y$ or layer expressed by $Al_xN_y$ has high barrier properties, and thus it can prevent rust.

Moreover, the single layer or laminated layer of the layer expressed by $AlN_xO_y$ or layer expressed by $Al_xN_y$ is coated over the surface of recording media, optical discs such as CDs (Compact Disc), and DVDs (Digital Versatile Disc) for protection, and the heat resisting properties and mechanical strength can be enhanced. Besides, the single layer or laminated layer of the layer expressed by $AlN_xO_y$ or layer expressed by $Al_xN_y$ prevents impurities contained in human perspiration from entering and it prevents the alteration and degradation of plastics. Thus, it can prolong the lifetime as the optical discs.

In addition, it is acceptable that the single layer or laminated layer of the layer expressed by $AlN_xO_y$ or layer expressed by $Al_xN_y$ is coated over the surface of light sources to form a protective film for electric lamps, fluorescent lights, and LEDs (Light Emitting Diode), for example. The single layer or laminated layer of the layer expressed by $AlN_xO_y$ or layer expressed by $Al_xN_y$ has high translucency, thus not lessening the function as the light sources. It also has high thermal conductivity, thus dispersing heat. Furthermore, the single layer or laminated layer of the layer expressed by $AlN_xO_y$, or layer expressed by $Al_xN_y$, can prevent impurities from entering and it can prolong the lifetime as the light sources.

The following examples will describe the invention formed of the above configurations in details.

EXAMPLES

Example 1

The implementation of the invention completes all the examples of the products shown in FIGS. 3A to 3F. FIGS. 3A to 3F show exemplary products coated with the single layer or laminated layer of the layer expressed by $AlN_xO_y$, or layer expressed by $Al_xN_y$.

Figure 3A:
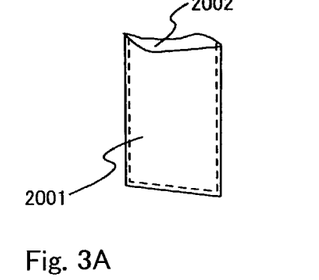
FIGS. 3A to 3F are diagrams depicting examples of the products.

FIG. 3A is a packaging bag 2001, a typical example of a snack food bag. With the use of the deposition apparatus shown in FIG. 1, a coating surface 2002 coated with the single layer or laminated layer of the layer expressed by $AlN_xO_y$ or layer expressed by $Al_xN_y$ is formed over the inner surface of the packaging bag. In addition, a bag with no seal is shown here for explanation, but the packaged goods such as snack food are fully covered with the coating surface when sealed.

Figure 3B:
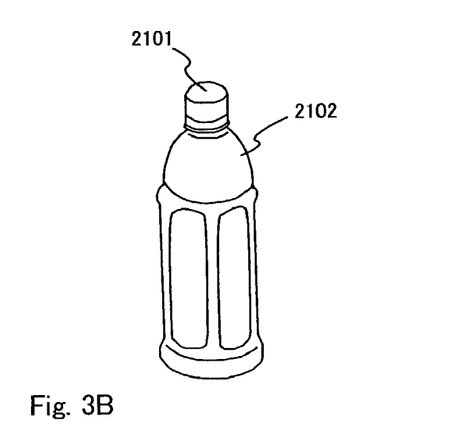

FIG. 3B is a container 2102, a typical example of a beverage bottle. With the use of the deposition apparatus shown in FIG. 4, the single layer or laminated layer of the layer expressed by $AlN_xO_y$, or layer expressed by $Al_xN_y$, is coated over the inner surface of the container. Furthermore, the single layer or laminated layer of the layer expressed by $AlN_xO_y$, or layer expressed by $Al_xN_y$, may be coated over the inner surface of a cap 2101 for sealing the container 2102.

Figure 3C:
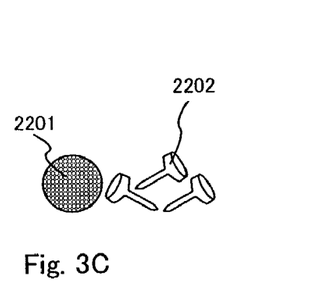

FIG. 3C is sports goods, a typical example of golf pins 2202. The single layer or laminated layer of the layer expressed by $AlN_xO_y$, or layer expressed by $Al_xN_y$, is coated over a part of the surface of the pin. The pin is consumables, and thus biodegradable plastic materials are preferably used for the environment. Moreover, the single layer or laminated layer of the layer expressed by $AlN_xO_y$, or layer expressed by $Al_xN_y$, may be coated over the surface of a golf ball 2201.

Figure 3D:
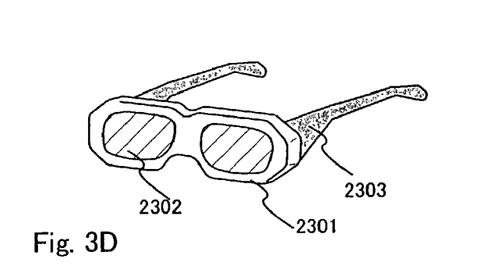

FIG. 3D is a diagram of the appearance of spectacles (including sunglasses) or goggles using glass lenses or plastic lenses. The single layer or laminated layer of the layer expressed by $AlN_xO_y$, or layer expressed by $Al_xN_y$, is coated over a lens 2302. Besides, the single layer or laminated layer of the layer expressed by $AlN_xO_y$ or layer expressed by $Al_xN_y$ may be coated over the surface of an arm part 2303 or main body 2301.

Figure 3E:
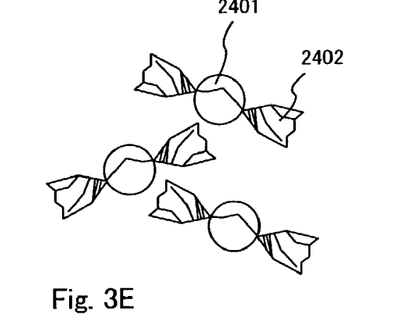

FIG. 3E is a packaging film, a typical example of a packaging film 2402 for candies (hard candies) 2401. The single layer or laminated layer of the layer expressed by $AlN_xO_y$ or layer expressed by $Al_xN_y$ is coated over one surface or both surfaces of the packaging film.

Figure 3F:
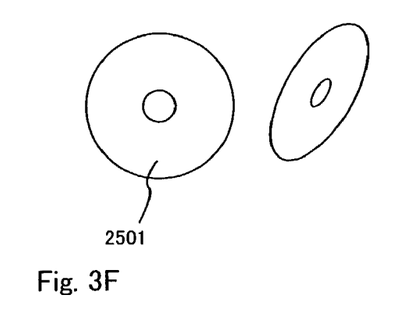

FIG. 3F is a recording medium, a typical example of an optical disc 2501 such as a CD (Compact Disc) or DVD (Digital Versatile Disc). The single layer or laminated layer of the layer expressed by $AlN_xO_y$ or layer expressed by $Al_xN_y$, is coated over one surface or both surfaces of the optical disc. Accordingly, the heat resisting properties and mechanical strength can be enhanced. The single layer or laminated layer of the layer expressed by $AlN_xO_y$ or layer expressed by $Al_xN_y$, has significantly high translucency, thus not hindering reading and writing data. In addition, the single layer or laminated layer of the layer expressed by $AlN_xO_y$ or layer expressed by $Al_xN_y$, prevents impurities contained in human perspiration from entering, and it prevents the alteration and degradation of resins used in the optical disc. Thus, it can prolong the lifetime as the optical disc 2501.

As described above, the application range of the invention is very wide, allowing implementation for products in any fields and for fabrication methods thereof.

According to the invention, it can provide the thin film capable of suppressing the degradation due to moisture, oxygen, and carbon dioxide gas and the degradation due to the diffusion of impurities such as alkali metals and alkali earth metals, that is, the thin film having significantly high barrier properties. In addition to this, the thin film has flexibility and significantly high translucency with no safety and health problems.

Furthermore, the apparatus for fabricating such the thin film and the products coated with the thin film obtained by the fabrication apparatus can be provided.

Moreover, when environmentally friendly biodegradable materials are used for packaging materials according to the invention, the usable range of the products is extended and the quality preservation period can be prolonged as well.

Besides, according to the invention, it can provide the lenses hardly subject to water drops and fog, and the spectacles, sunglasses, and magnifying glasses with the lenses.

What is claimed is:

1. A packaging material comprising:
   a layer comprising Al, N, and O deposited over an outer surface or an inner surface of a bag made of a plastic material,
   wherein the layer contains nitrogen at a concentration of 2.5 to 47.5 atm %,
   wherein the layer contains oxygen at a concentration of 2.5 to 47.5 atm %, and
   wherein the layer contains nitrogen at a higher concentration than a concentration of oxygen.

2. The packaging material according to claim 1, wherein the layer comprising Al, N, and O has 80 to 90% of translucency in a visible light area.

3. A packaging material comprising:
   a layer comprising Al, N, and O deposited over an outer surface or an inner surface of a bag made of a biodegradable plastic material,
   wherein the layer contains nitrogen at a concentration of 2.5 to 47.5 atm %,
   wherein the layer contains oxygen at a concentration of 2.5 to 47.5 atm %, and
   wherein the layer contains nitrogen at a higher concentration than a concentration of oxygen.

4. The packaging material according to claim 3, wherein the layer comprising Al, N, and O has 80 to 90% of translucency in a visible light area.

5. A container comprising:
   a layer comprising Al, N, and O deposited over an outer wall surface or an inner wall surface of the container,
   wherein the container is made of biodegradable plastic material,
   wherein the layer contains nitrogen at a concentration of 2.5 to 47.5 atm %,
   wherein the layer contains oxygen at a concentration of 2.5 to 47.5 atm %, and
   wherein the layer contains nitrogen at a higher concentration than a concentration of oxygen.

6. The container according to claim 5, wherein the layer comprising Al, N, and O has 80 to 90% of translucency in a visible light area.

7. A recording medium comprising:
a layer comprising Al, N, and O deposited over a surface or the recording medium,
wherein the layer contains nitrogen at a concentration of 2.5 to 47.5 atm %,
wherein the layer contains oxygen at a concentration of 2.5 to 47.5 atm %, and
wherein the layer contains nitrogen at a higher concentration than a concentration of oxygen.

8. A film comprising:
at least two layers each comprising Al, N, and O;
a stress relaxation film between the layers comprising Al, N, and O; and
a substrate,
wherein at least one of the layers comprising Al, N, and O is deposited on and in direct contact with one surface or both surfaces of the substrate,
wherein said at least two layers each comprising Al, N, and O contain nitrogen at a concentration of 2.5 to 47.5 atm %,
wherein said at least two layers each comprising Al, N, and O contain oxygen at a concentration of 2.5 to 47.5 atm %, and
wherein said at least two layers each comprising Al, N. and O contain nitrogen at a higher concentration than a concentration of oxygen.

9. The film according to claim 8, wherein said at least two layers each comprising Al, N, and O have 80 to 90% of translucency in a visible light area.

10. A packaging material comprising:
at least two of layers each comprising Al, N, and O; and
a stress relaxation film between the layers comprising Al, N, and O,
wherein at least one of the layers comprising Al, N, and O is deposited over at least one of outer surface and inner surface of a bag made of a plastic material,
wherein said at least two layers each contain nitrogen at a concentration of 2.5 to 47.5 atm %,
wherein said at least two layers each contain oxygen at a concentration of 2.5 to 47.5 atm %, and
wherein said at least two layers each contain nitrogen at a higher concentration than a concentration of oxygen.

11. The packaging material according to claim 10, wherein said at least two layers each comprising Al, N, and O have 80 to 90% of translucency in a visible light area.

12. A packaging material comprising:
at least two layers each comprising Al, N, and O; and
a stress relaxation film between the layers comprising Al, N, and O,
wherein at least one of the layers comprising Al, N, and O is deposited over an outer surface or an inner surface of a bag made of a biodegradable plastic material,
wherein said at least two layers each contain nitrogen at a concentration of 2.5 to 47.5 atm %,
wherein said at least two layers each contain oxygen at a concentration of 2.5 to 47.5 atm %, and
wherein said at least two layers each comprising Al, N, and O contain nitrogen at a higher concentration than a concentration of oxygen.

13. The packaging material according to claim 12, wherein said at least two layers each comprising Al, N, and O have 80 to 90% of translucency in a visible light area.

14. A container comprising:
at least two layers each comprising Al, N, and O; and
a stress relaxation film between the layers comprising Al, N, and O,
wherein at least one of the layers comprising Al, N, and O is deposited over an outer wall surface or an inner wall surface of the container,
wherein the container is made of a glass material or plastic material,
wherein said at least two layers each contain nitrogen at a concentration of 2.5 to 47.5 atm %,
wherein said at least two layers each contain oxygen at a concentration of 2.5 to 47.5 atm %, and
wherein said at least two layers each comprising Al, N, and O contain nitrogen at a higher concentration than a concentration of oxygen.

15. The container according to claim 14, wherein said at least two layers each comprising Al, N, and O have 80 to 90% of translucency in a visible light area.

16. A container comprising:
at least two layers each comprising Al, N, and O; and
a stress relaxation film between the layers comprising Al, N, and O,
wherein at least one of the layers comprising Al, N, and O is deposited over an outer wall surface or an inner wall surface of the container made of biodegradable plastic material,
wherein said at least two layers each comprising Al, N, and O contain nitrogen at a concentration of 2.5 to 47.5 atm %,
wherein said at least two layers each comprising Al, N, and O contain oxygen at a concentration of 15 to 47.5 atm %, and
/wherein said at least two layers each comprising Al, N, and O contain nitrogen at a higher concentration than a concentration of oxygen.

17. The container according to claim 16, wherein said at least two layers each comprising Al, N, and O have 80 to 90% of translucency in a visible light area.

18. A lens or window comprising:
at least two layers comprising Al, N, and O; and
a stress relaxation film between the layers comprising Al, N, and O,
wherein at least one of layers comprising Al, N, and O is deposited on and in direct contact with one surface or both surfaces of the substrate of the lens or the window and
wherein said at least two layers each comprising Al, N, and O contain nitrogen at a higher concentration than a concentration of oxygen.

19. The lens or window according to claim 18, wherein the lens or window is made of plastic or glass.

20. Spectacles comprising the lens according to claim 18.

21. The lens or window according to claim 18, wherein said at least two layers each comprising Al, N, and O contain 2.5 to 47.5 atm % of nitrogen.

22. The lens or window according to claim 18, wherein said at least two layers each comprising Al, N, and O contain 2.5 to 47.5 atm % of oxygen.

23. A recording medium comprising:
a layer comprising Al and N deposited over a surface of the recording medium,
wherein the layer comprising Al and N contains 2.5 to 47.5 atm % of nitrogen,
wherein the layer comprising Al and N is deposited on and in direct contact with one surface or both surfaces of the recording medium, and
wherein the layer contains nitrogen at a higher concentration than a concentration of oxygen.

24. A recording medium comprising:
at least two layers comprising Al, N, and O deposited on and indirect contact with both surfaces of the recording medium; and
a stress relaxation film between the layers comprising Al, N, and O,
wherein said at least two layers each comprising Al, N, and O contain nitrogen at a concentration of 2.5 to 47.5 atm %,
wherein said at least two layers each comprising Al, N, and O contain oxygen at a concentration of 2.5 to 47.5 atm %, and
wherein said at least two layers each comprising Al, N, and O contain nitrogen at a higher concentration than a concentration of oxygen.

* * * * *